United States Patent [19]

Taylor

[11] Patent Number: 5,517,616
[45] Date of Patent: May 14, 1996

[54] MULTI-PROCESSOR COMPUTER SYSTEM WITH SYSTEM MONITORING BY EACH PROCESSOR AND EXCHANGE OF SYSTEM STATUS INFORMATION BETWEEN INDIVIDUAL PROCESSORS

[75] Inventor: Richard N. Taylor, Congleton, England

[73] Assignee: International Computers Limited, Putney, United Kingdom

[21] Appl. No.: 509,418

[22] Filed: Jul. 31, 1995

Related U.S. Application Data

[63] Continuation of Ser. No. 243,921, May 17, 1994, abandoned.

[30] Foreign Application Priority Data

Jun. 26, 1993 [GB] United Kingdom ............... 9313255

[51] Int. Cl.⁶ .................................................. G06F 11/22
[52] U.S. Cl. .......................... 395/182.09; 364/DIG. 1; 364/DIG. 2; 364/264; 364/265; 364/266; 364/267; 364/267.7; 364/268; 364/268.1; 364/944.61; 364/944.9; 364/945.4; 364/943.9; 364/943.91

[58] Field of Search ............... 364/DIG. 1 MS File, 364/DIG. 2 MS File; 395/180, 181, 182.02, 182.04, 182.09, 182.11, 183.01, 183.07, 185.01

[56] References Cited

U.S. PATENT DOCUMENTS 4,590,550  5/1986  Eilert et al. ........................... 395/575
5,272,702  12/1993  Snowbarger et al. ............... 370/85.4

*Primary Examiner*—Robert B. Harrell
*Attorney, Agent, or Firm*—Lee, Mann, Smith, McWilliams, Sweeney & Ohlson

[57] ABSTRACT

A computer system comprises a number of replicated units. At least two of the units include monitoring components for monitoring the status of the system. The monitoring components communicate with each other to exchange status information, so as to enable both of the monitoring components to form a combined view of the status of the system, based on information gathered by both of the monitoring components. This enables each monitoring component to locate faults more precisely, and thus enables more appropriate recovery action to be taken.

6 Claims, 2 Drawing Sheets

MULTI-PROCESSOR COMPUTER SYSTEM WITH SYSTEM MONITORING BY EACH PROCESSOR AND EXCHANGE OF SYSTEM STATUS INFORMATION BETWEEN INDIVIDUAL PROCESSORS

This application is a continuation, of application Ser. No. 08/243,921, filed May 17, 1994, now abandoned.

BACKGROUND OF THE INVENTION

This invention relates to fault-tolerant computer systems. It is well known that fault tolerance can be achieved in a computer system by replicating components of the system. For example, two processing units may be provided, one of which acts as the active unit and the other of which acts as a stand-by. When a fault is detected in the active unit, from which it cannot recover, the stand-by is switched in as the active unit, allowing system operation to continue. Similarly, it is known to replicate data storage units using disk mirroring systems.

A problem which arises in such a system is how to locate faults precisely, to enable more appropriate recovery action to be taken. The object of the invention is to provide a novel way of solving this problem.

SUMMARY OF THE INVENTION

According to the invention there is provided a computer system comprising a plurality of interconnected units, wherein at least two of the units include monitoring means for monitoring the status of the system, and wherein said monitoring means communicate with each other to exchange status information, thereby enabling both of said monitoring means to form a combined view of the status of the system, based on information gathered by both said monitoring means.

It will be shown that the invention allows faults to be identified on the basis of a global view of the system, rather than merely a local view, and hence makes it possible to identify more specifically where a failure has occurred, so that the most appropriate recovery action may be taken without operator intervention.

DESCRIPTION OF AN EMBODIMENT OF THE INVENTION

One computer system in accordance with the invention will now be described by way of example with reference to the accompanying drawings.

Figure 1:
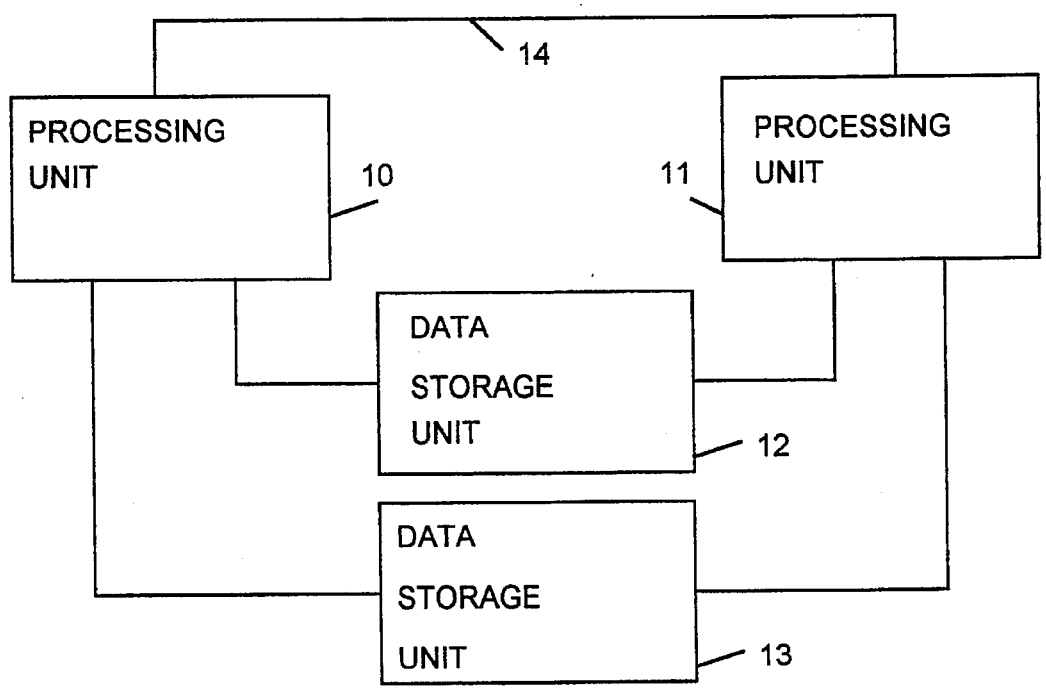
FIG. 1 is an overall block diagram of a fault-tolerant computer system embodying the invention.

Referring to FIG. 1, the system comprises two processing units 10 and 11. Each of these processing units may comprise, for example, an ICL DRS 6000 processor, running under the UNIX operating system. The processor units both have access to two data storage units 12 and 13. Each data storage unit may, for example, comprise a cabinet holding a number of disk drives. The processing units are interconnected by one or more local area networks (LANs) 14.

In operation, one of the processing units 10, 11 acts as the active unit, and the other is the stand-by. If a fault condition is detected which indicates a failure of the active processing unit, the system can be switched over to make the other processing unit the active unit, allowing the operation of the system to continue.

The data storage units 12, 13 are used in parallel, with data being mirrored between the two units. Hence, if one of the data storage units fails, the data is still available and system operation can continue. A further data storage unit (not shown) may also be provided as a stand-by so that mirror operation may be continued after failure of one of the units.

Each of the processing units 10, 11 runs a software component referred to herein as the high availability manager (HAM), the purpose of which is to provide a system monitoring and management facility.

Figure 2:
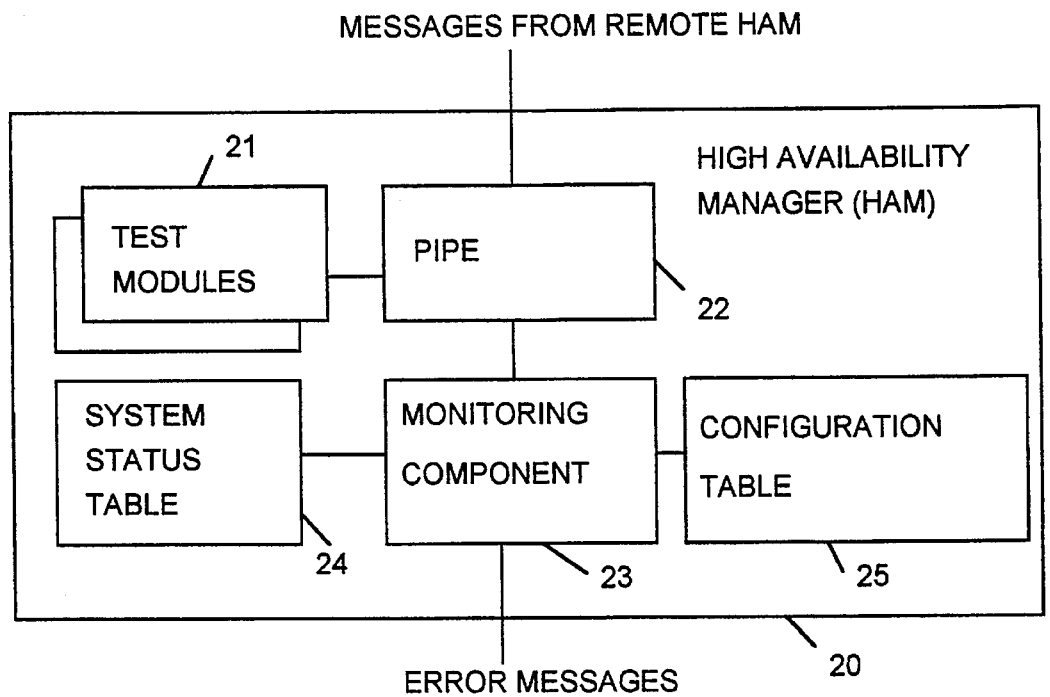
FIG. 2 is a block diagram of a high availability manager (HAM) component of the system.

Referring to FIG. 2, this shows one of the HAMs. The HAM 20 comprises a number of sub-test modules 21 which perform various checks on the local processor (ie the processor in which the HAM is running) and on the units connected to it. For example, these checks include checking the interfaces between the processor and the data storage units. The test modules 21 generate a sequence of status reports. As will be described, the HAM also receives status reports from the HAM in the remote processing unit.

The status reports, from the test modules and from the remote HAM, are fed by way of a UNIX pipe 22 to a monitoring component 23. The monitoring component runs periodically, every two to three seconds, to read the status reports from the pipe 22 and to take the appropriate actions. The monitoring component 23 maintains a system status table 24, which holds an entry for each of the sub-tests, containing the latest status report from that sub-test. Each entry includes an age value which is reset to a predetermined initial value whenever a status report is received from the corresponding sub-test. All the age values in the status table are periodically decremented by the monitoring component. Hence, each age value indicates how long the corresponding status report has been valid.

The monitoring component also has access to a configuration file 25, containing a number of records. Each record specifies a particular combination of one or more status reports, and specifies an action to be performed when this combination occurs. The action may, for example comprise displaying an error message to the operator, or performing some automatic fault recovery action. Each record in the configuration file may also optionally contain a time value, which specifies how long the status report must be valid before the action is triggered. This is to allow time for the other processor to forward its report about a particular fault situation, so that a system-wide decision can be made about the location of the fault and what action to take. A status report is considered to be "mature" if its age value in the status table is less than this time value.

As will be described in more detail below, the monitoring component scans the configuration file to find a record that matches the currently reported fault conditions in the status report file. If a record is found, the action specified in that record is performed.

Figure 3:
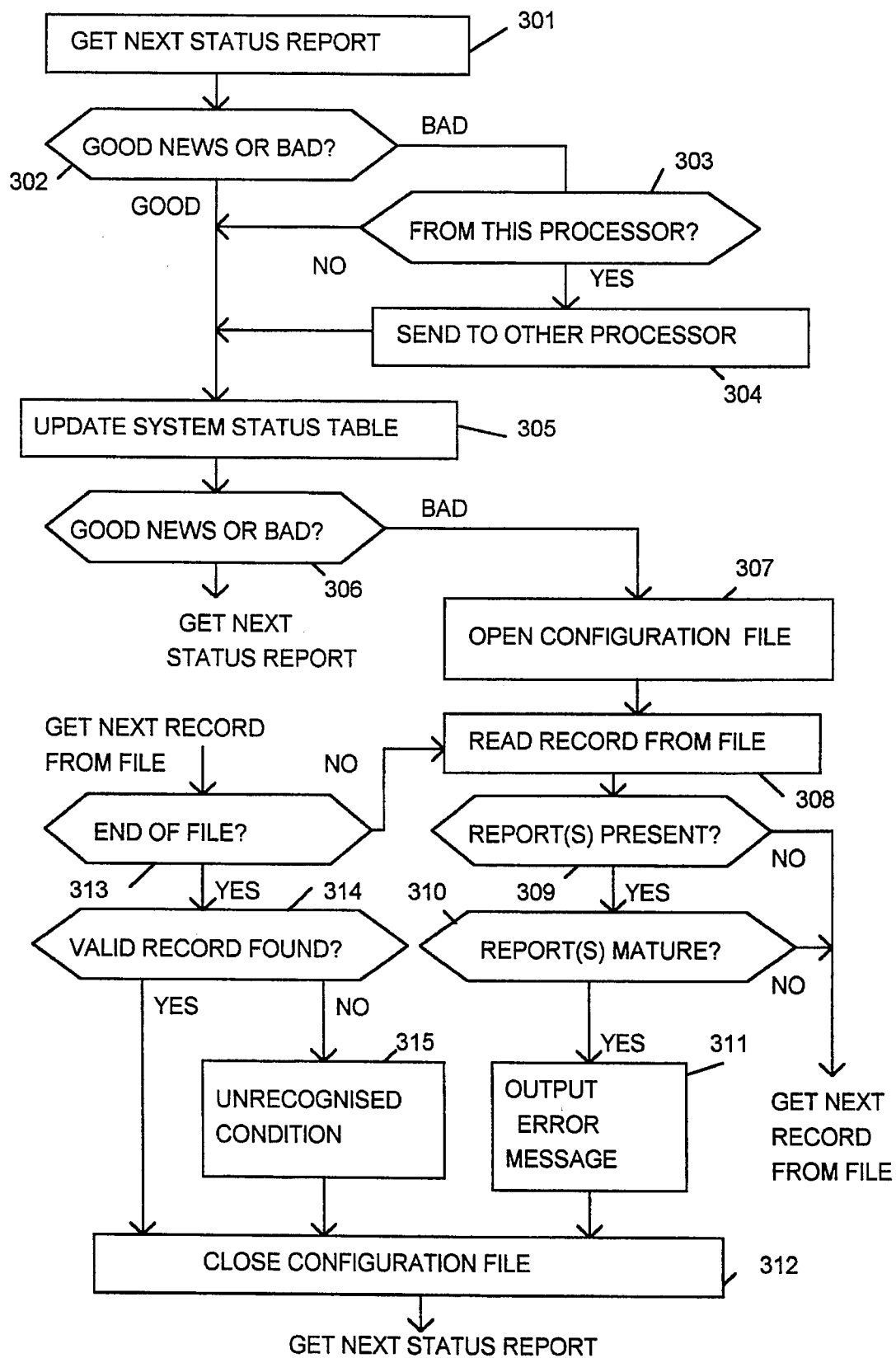
FIG. 3 is a flow chart showing the operation of the HAM.

Referring now to FIG. 3, this is a flow chart showing the operation of the monitoring component 23.

(301) The monitoring component gets a status report from the pipe 22.

(302) The monitoring component then checks the status report to see whether it is good or bad, ie whether it indicates that new fault condition has been detected.

(303) If the status report is bad, a check is made to see whether the status report came from the local processing unit, or from the remote processing unit.

(304) If the status report came from the local processing unit, a message is generated, containing the status report, and is sent to the remote processing unit over the LAN 14. When the HAM in the remote processing unit receives this message, it passes the status report to its pipe 22.

(305) The monitoring component then updates the appropriate entry in its local status table 24, by writing the status report into the entry and resetting the age value of the entry.

(306) If the status report was good, the monitoring component then returns to step 301 above, to get the next status report from the pipe 22. If, on the other hand, the status report was bad, the following steps are performed.

(307) The configuration file 25 is opened.

(308) A record is read from the configuration file.

(309) The status table 24 is then examined, to see whether the particular report or combination of reports specified by the record is present.

(310) If the specified combination of status reports is present, these reports are checked to see whether they are mature, ie whether they have been valid for a length of time greater than the time value (if any) specified in the configuration file record. This involves comparing the age values in the status table entries with the time values in the configuration file record.

(311) If the reports are mature, the monitoring component generates an error message, which indicates the actions specified in the configuration file record. The associated entries in the status table 24 are marked as "reported". Once marked in this way, an error condition is ignored by the monitoring component, until the condition changes or is cleared.

(312) The configuration file is then closed, and the monitoring component returns to step 301 above, to get the next status report.

(313) If the specified combination of status reports is not present, or if the reports are not yet mature, a check is made to see whether the end of the configuration file has been reached. If not, the monitoring component returns to step 308 above, to read the next record from the configuration file.

(314) If the end of the configuration file is reached, a check is made to see whether any records in the configuration file have been found relating to the current status report.

(315) If no valid records were found, an error message is generated, indicating that an unrecognised fault condition has been detected. The monitoring component then proceeds to step 312, so as to close the configuration file and to get the next status report.

In summary, it can be seen that each HAM makes decisions about the location of faults on the basis of the contents of its status report file. Each status report file holds status reports generated by both HAMs. Hence, each HAM is able to analyze a fault on the basis not only of local information, gathered by the local test modules 21, but also information sent to it from the HAM in the remote processor. Thus, each HAM is able to locate a fault on the basis of a global view of the system, rather than merely a local view.

For example, if one of the processing units has a failure on one of its data storage interfaces, its HAM will detect that the corresponding data storage unit has disappeared, and will send a status report message to the HAM in the other processing unit to inform it of this. Meanwhile, the HAM in the other processing unit will detect that both data storage units are working normally, and will send a status report message to the HAM in the first processing unit to inform it of this. Thus, both HAMs will be able to deduce from the status reports in their status tables that a data storage interface on the first processing unit has failed, and both will take suitable action to recover from this fault, eg by switching over to make the second processing unit the active processor. It will be appreciated that without the exchange of information between the HAMs, neither HAM would have been able to identify the location of this fault.

I claim:

1. A computer system comprising;
   (a) a first processing unit;
   (b) a second processing unit;
   (c) a plurality of further system units, each of said plurality of further system units being connected both to said first processing unit and to said second processing unit;
   (d) first monitoring means in said first processing unit, for monitoring said plurality of further system units, to generate a first status report containing status information relating to said further system units as viewed from said first processing unit;
   (e) second monitoring means in said second processing unit, for monitoring said plurality of further system units, to generate a second status report containing status information relating to said further system units as viewed from said first processing unit;
   (f) said first monitoring means including means for generating a first status message, containing said first status report, and for transmitting said first status message to said second monitoring means; and
   (g) said second monitoring means including means for generating a second status message, containing said second status report, and for transmitting said second status message to said first monitoring means.

2. A system according to claim 1 wherein:
   (a) said first monitoring means includes a first status table, means for inserting said first status report into said first status table, means for inserting said second status report from said second status message into said first status table, and means for searching said first Status table for a predetermined combination of status reports and for initiating a predetermined action upon detection of said combination; and
   (b) said second monitoring means includes a second status table, means for inserting said second status report into said second status table, means for inserting said first status report from said first status message into said second status table, and means for searching said second status table for a predetermined combination of status reports and for initiating a predetermined action upon detection of said combination.

3. A system according to claim 2 wherein:
   (a) said first status table includes means for storing age values for status reports stored in said first status table, and means for ignoring said status reports stored in said first status table while said age values are less than a predetermined value; and (b) said second status table includes means for storing age values for status reports stored in said second status table, and means for ignoring said status reports stored in said second status table while said age values are less than a predetermined value.

4. A system according to claim 1 wherein said further system units comprise a plurality of data storage units.

5. A system according to claim 4 wherein said plurality of data storage units store mirrored data.

6. A system according to claim 1 wherein:

(a) said first monitoring means includes means for combining said first status report with said second status message to generate a first combined status report for said further system units; and (b) said second monitoring means includes means for combining said second status report with said first status message to generate a second combined status report for said further system units.

\* \* \* \* \*